US009543157B2

(12) United States Patent
Renner et al.

(10) Patent No.: US 9,543,157 B2
(45) Date of Patent: Jan. 10, 2017

(54) METHOD FOR PROCESSING A CARRIER, A METHOD FOR OPERATING A PLASMA PROCESSING CHAMBER, AND A METHOD FOR PROCESSING A SEMICONDUCTOR WAFER

(71) Applicant: INFINEON TECHNOLOGIES AG, Neubiberg (DE)

(72) Inventors: Michael Renner, Moritzburg (DE); Lothar Brencher, Radeberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/501,055

(22) Filed: Sep. 30, 2014

(65) Prior Publication Data

US 2016/0093500 A1 Mar. 31, 2016

(51) Int. Cl.
| | | |
|---|---|---|
| H01L 21/302 | (2006.01) |
| B44C 1/22 | (2006.01) |
| C03C 15/00 | (2006.01) |
| C03C 25/68 | (2006.01) |
| C23F 1/00 | (2006.01) |
| H01L 21/3065 | (2006.01) |
| H01L 21/311 | (2006.01) |
| H01L 21/30 | (2006.01) |
| H01L 21/02 | (2006.01) |
| H01L 21/3213 | (2006.01) |

(52) U.S. Cl.
CPC ....... *H01L 21/3065* (2013.01); *H01L 21/0234* (2013.01); *H01L 21/3003* (2013.01); *H01L 21/31116* (2013.01); *H01L 21/32136* (2013.01)

(58) Field of Classification Search
None
See application file for complete search history.

(56) References Cited

U.S. PATENT DOCUMENTS

| | | | |
|---|---|---|---|
| 6,374,833 B1 * | 4/2002 | Yuan et al. | 134/1.1 |
| 7,001,848 B1 * | 2/2006 | Smith | G03F 7/427 |
| | | | 257/E21.256 |
| 2004/0200498 A1 * | 10/2004 | Wang et al. | 134/1.1 |
| 2006/0137710 A1 * | 6/2006 | Lim et al. | 134/1.1 |
| 2006/0163203 A1 * | 7/2006 | Buie et al. | 216/67 |

\* cited by examiner

*Primary Examiner* — Stephanie Duclair
(74) *Attorney, Agent, or Firm* — Viering, Jentschura & Partner mbB

(57) ABSTRACT

According to various embodiments, a method for processing a carrier may include: performing a dry etch process in a processing chamber to remove a first material from the carrier by an etchant, the processing chamber including an exposed inner surface including aluminum and the etchant including a halogen; and, subsequently, performing a hydrogen plasma process in the processing chamber to remove a second material from at least one of the carrier or the inner surface of the processing chamber.

18 Claims, 6 Drawing Sheets

```
┌─────────────────────────────────────────────────────────────────────┐
│ Performing a first plasma process in a plasma processing chamber to provide │  410
│ a first plasma, the plasma processing chamber including an exposed inner    │
│ surface including aluminum and the first plasma is provided from a halogen  │
│                         containing gas                                      │
└─────────────────────────────────────────────────────────────────────┘
                                    │
                                    ▼
┌─────────────────────────────────────────────────────────────────────┐
│ Performing a second plasma process in the plasma processing chamber to      │  420
│    provide a second plasma, the second plasma is provided from gaseous      │
│                              hydrogen                                       │
└─────────────────────────────────────────────────────────────────────┘
```

METHOD FOR PROCESSING A CARRIER, A METHOD FOR OPERATING A PLASMA PROCESSING CHAMBER, AND A METHOD FOR PROCESSING A SEMICONDUCTOR WAFER

TECHNICAL FIELD

Various embodiments generally relate to a method for processing a carrier, a method for operating a plasma processing chamber, and a method for processing a semiconductor wafer.

BACKGROUND

In general, semiconductor processing, e.g. for manufacturing an integrated circuit, may include a plurality of processes in various technologies, typically including layering, patterning, doping, and/or annealing. A process for removing material from a carrier during semiconductor processing may include dry etching, as for example plasma etching, ion beam milling, or reactive ion etching (RIE). A plasma process, as for example reactive ion etching, may be performed in a processing chamber (e.g. in a plasma processing chamber). The plasma may be provided by means of an inductively coupled plasma (ICP) source or by means of a capacitively coupled plasma (CCP) source from a plasma-forming gas (e.g. from a gaseous etchant or from a reactive gas).

SUMMARY

According to various embodiments, a method for processing a carrier may include: performing a dry etch process in a processing chamber to remove a first material from the carrier by an etchant; the processing chamber including an exposed inner surface including aluminum and the etchant including a halogen; and, subsequently, performing a hydrogen plasma process in the processing chamber to remove a second material from at least one of the carrier or the inner surface of the processing chamber.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

According to various embodiments, at least one integrated circuit structure (or at least one integrated circuit) may be formed at least one of over or in a carrier. The carrier may be a semiconductor carrier, e.g. a semiconductor wafer, e.g. semiconductor substrate, or a semiconductor work piece, or the carrier may be any suitable carrier including at least one region made of semiconductor material.

According to various embodiments, a carrier, an integrated circuit, and/or an integrated circuit structure may include or may be configured to provide at least one of the following: a readily processed integrated circuit, a CMOS (complementary metal oxide semiconductor) integrated circuit, a bipolar transistor, a field effect transistor, a diode, an IGBT, and/or a micro-electro-mechanical system (MEMS), or another component or another structure, as for example, a chip, a memory chip, a die, a microprocessor, a micro-controller, a memory structure, a charge storage memory, a random access memory, a dynamic random access memory, a logic circuit, an integrated battery structure, a sensor, a nano-sensor, an integrated transceiver, a micro-mechanical device, a micro-electronic device, a nano-electronic device, an electrical circuit, a digital circuit, an analog circuit, and any other electronic device based on semiconductor technology.

In case the carrier is a wafer, the carrier may include a plurality of integrated circuit structures or integrated circuits, which can be singulated from the carrier to provide a plurality of dies or chips including at least one integrated circuit structure or integrated circuit respectively.

According to various embodiments, a carrier (e.g. a substrate, a wafer, or a work piece) may be made of or may include semiconductor materials of various types, including, for example, silicon, germanium, Group III to V or other types, including polymers, for example, although in another embodiment, other suitable materials can also be used. In an embodiment, the carrier is made of silicon (doped or undoped), in an alternative embodiment, the carrier is a silicon on insulator (SOI) wafer. As an alternative, any other suitable semiconductor materials can be used for the carrier, for example semiconductor compound material such as gallium arsenide (GaAs), indium phosphide (InP), but also any suitable ternary semiconductor compound material or quaternary semiconductor compound material such as indium gallium arsenide (InGaAs). According to various embodiments, the carrier may be a thin or an ultrathin substrate or wafer, e.g. with a thickness in the range from about several micrometers to about several tens of micrometers, e.g. in the range from about 5 µm to about 50 µm, e.g. with a thickness less than about 100 µm or less than about 50 µm. According to various embodiments, a carrier may include SiC (silicon carbide) or may be a silicon carbide carrier, a silicon carbide substrate, a silicon carbide wafer, or a silicon carbide work piece.

Since there may be many individual processes used in semiconductor processing (e.g. for processing a carrier or for processing a semiconductor wafer) for manufacturing an integrated circuit structure or an integrated circuit on a carrier, usually carried out in sequence, several basic manufacturing techniques may be used at least once in the overall manufacturing process. The following description of basic techniques should be understood as illustrating examples, which techniques may be included in the processes described herein. The exemplarily described basic techniques may be not necessarily needed to be construed as preferred or advantageous over other techniques or methods, since they only serve to illustrate how one or more embodiments of the invention may be practiced. For sake of brevity, the illustration of exemplarily described basic techniques may be only a short overview and should not be considered as exhaustive specification.

In general, a layer (also referred to as film or thin film) may be deposited over a surface (e.g. over a carrier, over a wafer, over a substrate, over another layer, over a plurality of structure elements, and the like) using deposition techniques which may include chemical vapor deposition (CVD, or a CVD process) and/or physical vapor deposition (PVD, or a PVD process), according to various embodiments. The thickness of a deposited layer may be in the range of a few nanometers up to several micrometers depending on its specific function.

According to various embodiments, a deposited (formed or provided) layer may include at least one of an electrically insulating material, an electrically semiconducting material, and/or an electrically conductive material, depending on the respective specific function of the deposited layer. According to various embodiments, electrically conductive materials, as for example aluminium, aluminium-silicon alloys, aluminium-copper alloys, copper, nichrome (an alloy of nickel, chromium, and/or iron), tungsten, titanium, titanium nitride, molybdenum, platinum, gold, carbon (graphite), or the like, may be deposited using a CVD process or a PVD process. According to various embodiments, semiconducting materials, as for example silicon (e.g. silicon, polycrystalline silicon (also referred to as polysilicon), or amorphous silicon), germanium, a semiconductor compound material such as gallium arsenide (GaAs), indium phosphide (InP), or indium gallium arsenide (InGaAs) may be deposited using a CVD process. Insulating materials, as for example silicon oxide, silicon nitride, silicon oxynitride, metal oxides (e.g. aluminum oxide), organic compounds, polymers, (or the like) may be deposited using a CVD process or a PVD process. According to various embodiments, modifications of these processes may be used as described in the following.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like. According to various embodiments, polysilicon, silicon dioxide, silicon nitride, and the like may be deposited using LPCVD, but also molybdenum, tantalum, titanium, nickel, tungsten, and the like may be deposited using LPCVD.

According to various embodiments, physical vapor deposition may include a variety of modifications, as for example sputtering (in other words sputter deposition), magnetron sputtering (in other words magnetron sputter deposition), reactive magnetron sputtering (in other words reactive magnetron sputter deposition), high-power impulse magnetron sputtering (in other words high-power impulse magnetron sputtering deposition), vacuum evaporation, molecular beam epitaxy (MBE), and the like.

According to various embodiments, a patterning process may be used for processing a carrier or for processing a semiconductor wafer, e.g. for manufacturing an integrated circuit structure, in semiconductor technology. According to various embodiments, a patterning process may include removing selected portions of a surface layer or removing selected portions of a material. After a surface layer may be partially removed, a pattern (or a patterned layer or patterned surface layer) may remain over the underlying structure (e.g. a pattern may remain on a carrier). Since a plurality of processes may be involved, according to various embodiments, there are various possibilities to perform a patterning process, wherein aspects may be: selecting at least one portion of a surface layer (or a material) which shall be removed, e.g. by forming a soft mask or hard mask over the surface layer; and removing the selected portions of a surface layer, e.g. using at least one etch process; the at least one etch process may be selective to the material to be removed and not affecting (removing) the soft mask or the hard mask. According to various embodiments, a soft mask may be a patterned resist layer (e.g. a patterned photo resist) and a hard mask may be a patterned material layer including mask material (e.g. any material which may allow a selective etching of the material to be removed).

According to various embodiments, a resist layer may be patterned by performing at least one lithographic process. A lithographic process may include, for example, applying a resist, exposing a resist and developing a resist, wherein a patterned resist layer (a soft mask, or a resist mask) may be generated by the lithographic process. Further, according to various embodiments, a pattern can be transferred from a patterned resist layer to a prior deposited or grown layer (or a carrier, and the like) using an etch process, wherein the previously deposited or grown layer may include a hard mask material as for example an oxide or a nitride (e.g. silicon oxide, e.g. silicon nitride) creating a so-called hard mask.

According to various embodiments, a variety of lithographic processes may be applied generating a soft mask (a so-called resist mask), as for example photolithography, microlithography or nanolithography, electron beam lithography, X-ray lithography, extreme ultraviolet lithography (EUV or EUVL), interference lithography, and the like. According to various embodiments, a lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

According to various embodiments, a resist, which may be included in a lithographic process, may be applied to cover a surface (e.g. a surface layer, a carrier, or a wafer, and the like) homogeneously. According to various embodiments, applying a resist may include spin coating to generate a thin homogenous layer of the resist. Afterwards, a resist may be prebaked to drive off excess resist solvent, according to various embodiments. According to various embodiments, several types of resists (e.g. a photoresist) may be used adapted to the process of exposing the resist to achieve desired results. According to various embodiments, positive photoresists (e.g. DNQ-Novolac, PMMA, PMIPK, PBS, and the like) may be used, whereby the resist that has been exposed to light becomes soluble to a photoresist developer, and/or negative photoresists (e.g. SU-8, poly isoprene, COP, and the like) may be used, whereby the resist that has been exposed to light becomes insoluble to a photoresist developer.

According to various embodiments, a resist may be exposed (e.g. exposing the photoresist to a pattern of light), which may be included in a lithographic process, to transfer a desired pattern to a resist, e.g. using light or electrons, wherein the desired pattern may be defined by a patterned mask (e.g. a glass carrier with a patterned chromium layer). According to various embodiments, mask-less lithography may be applied, wherein a precise beam (e.g. an electron beam or a laser beam) may be projected without using a mask directly onto the surface including the resist. According to various embodiments, the exposure to light may cause a reaction in the resist that may allow some of the resist to be removed by a special solution (a so-called developer, e.g. a photoresist developer). Since the resolution of an optical imaging process is limited by the used wavelength, the wavelength of the used light may range from the wavelength of the visible light to a smaller wavelength in the ultra violet range, according to various embodiments. According to various embodiments, the exposure may be performed using x-rays or electrons having even a shorter wavelength than ultra violet light. According to various embodiments, projection exposure systems (steppers or scanners) may be used projecting the mask many times onto a surface including a resist to create the complete exposure pattern.

According to various embodiments, a resist may be developed (e.g. developing the photoresist using a photoresist developer), which may be included in a lithographic process, to partially remove the resist generating a patterned resist layer remaining on the surface (e.g. on a surface layer or on a carrier, a wafer, and the like). According to various embodiments, developing a resist may include a post exposure bake (a heat treatment, e.g. rapid thermal processing) before the actual developing process may be performed. According to various embodiments, the developing process may include a special chemical solution (a so-called developer) as for example sodium hydroxide or tetramethylammonium hydroxide (TMAH, a metal ion free developer). According to various embodiments, the remaining patterned resist may be solidified in a hard bake process (a heat treatment, e.g. rapid thermal processing), realizing a more durable protecting layer for later processes as for example ion implantation, wet chemical etching, or plasma etching (and the like). According to various embodiments, a resist or a resist layer (e.g. a soft mask) may be removed by ashing, e.g. by means of plasma ashing (plasma etching).

According to various embodiments, an etch process, which may be included in a patterning process, may be applied to remove material from a prior deposited layer, a grown surface layer, a carrier (or substrate, or wafer), and the like. According to various embodiments, an etch process may be performed depending on the specific requirements for this process. According to various embodiments, an etch process may be selective or non-selective with respect to a specific material. According to various embodiments, an etch process may be isotropic or anisotropic, wherein an anisotropic etch process (e.g. a wet etch process) may reveal a different etching rate along a respective crystallographic direction of a specific material or wherein an anisotropic etch process (e.g. a dry etch process) may reveal a different etching rate for surfaces with a specific geometric alignment. According to various embodiments, plasma etching (e.g. reactive ion etching (RIE)) may be a dry etch process.

According to various embodiments, a plasma process, e.g. plasma etching (also called reactive ion etching) or plasma ashing, may be used in semiconductor processing to remove or partially remove a solid material (e.g. a metal, a metalloid, a metal compound, a metal alloy, or polymer, e.g. a resist) by transferring the solid material into a gas phase.

A plasma process may generate charged ions, neutral atoms and/or radicals. The plasma (including for example the charged ions, the neutral atoms and/or radicals) may be provided from a gas or from a gaseous material. According to various embodiments, a plasma or a plasma process, as referred to herein, may be a low-pressure plasma, a so called non thermal plasma, which may be generated in a vacuum by a plasma source.

Plasma etching or a plasma etch process may include providing an etchant, e.g. in gas form, in a plasma processing chamber and forming plasma from the etchant. During the plasma etch process (in other words during plasma etching) the chemical reactions between the elements of the etched material and the reactive species generated by the plasma may generate volatile etch products (e.g. etch products being volatile at room temperature and/or etch products being volatile at the pressure provided in the plasma processing chamber). Therefore, according to various embodiments, a plasma etch process may be highly selective, partially selective, or non-selective depending on the used gaseous plasma etchants and the involved materials.

According to various embodiments, a plasma etch process may be applied, the plasma etch process may be selective to a metal; a metalloid, a metal alloy; a metal nitride; a metalloid nitride; a metal oxide; a metalloid oxide; a metal oxynitride; a metalloid oxynitride; a metal carbide; a metalloid carbide, wherein a resist or a photoresist (a polymer or an organic compound) may not be removed by the applied plasma etch process. Therefore, an etchant may be used including a halogen. In other words, the etchant may include or may be a (molecular) halogen compound, the halogen compound (e.g. the molecules of the halogen compound) including at least one of F, Cl, Br, and I, as for example a halide, a halocarbon, or any other compound including a halogen (e.g. $CF_4$, $SF_6$, $NF_3$). Further, the etchant may include an interhalogen compound with at least two different halogens, e.g. with fluorine and chlorine. The etchant may have a molecular structure to be provided in gas form (in other words to be provided as gas). Further, the etchant may include or may be a halogen gas, as for example $F_2$, $Cl_2$, $Br_2$, $I_2$, or a mixture of various halogen gases, or a mixture of one or more halogen gases with another gas (e.g. with $N_2$ or He).

In semiconductor processing plasma ashing may be used to remove the photoresist after an etch process. A reactive species may be generated by a plasma source, e.g. typically oxygen or fluorine. According to various embodiments, hydrogen may be used for plasma ashing. Therefore, a hydrogen gas ($H_2$) or a hydrogen containing gas (e.g. a mixture of $H_2$ and $N_2$) may be provided, wherein a plasma is generated from the provided hydrogen gas or a hydrogen containing gas by means of a plasma source according to various embodiments. The reactive species, e.g. hydrogen atoms and/or hydrogen ions, may combine with the photoresist to form a volatile product which can be removed from the plasma processing chamber by means of a vacuum pump.

According to various embodiments, a plasma may be formed within the processing chamber or, alternatively, the plasma may be formed remotely outside the processing chamber and the desired reactive species may be channeled to the carrier including the resist to be ashed.

According to various embodiments, plasma ashing may include high temperature ashing, or stripping, to remove the photo resist completely and, for example, as fast as possible. Alternatively, plasma ashing may include the so called descum process to remove residual photo resist from a surface or to partially remove a resist.

According to various embodiments, processing a semiconductor device may include forming an integrated circuit structure and providing a suitable metallization for operating the integrated circuit structure. The metallization may include patterned metal layers or metal structures (e.g. vias, metal lines, and the like) which may require an etch process, as already described. According to various embodiments, a contact metallization process may be applied in semiconductor processing to provide electrical contacts (in other words the contact pads) for a semiconductor device or for an integrated circuit structure, the electrical contacts may be necessary for operating the semiconductor device or the integrated circuit structure. A contact metallization may have direct physical contact with at least one integrated circuit structure, e.g. with a terminal of a transistor or with a terminal of a diode, provided on and/or in a carrier. According to various embodiments, a contact metallization process may include at least one layering process and/or at least one patterning process. According to various embodiments, a contact metallization process may include depositing a layer of a dielectric material (also called an interlayer dielectric, e.g. a low-k dielectric material, e.g. undoped silicate glass, and the like), forming contact holes at the desired locations (e.g. using a patterning process) and filling the contact holes with at least one electrically conductive material (e.g. at least one of a metal (e.g. aluminum, copper, tungsten, titanium, molybdenum, gold, and the like), a metallic material (e.g. titanium nitride, platinum silicide, titanium silicide, tungsten silicide, molybdenum silicide, and the like), electrically conductive silicon (e.g. electrically conductive polysilicon), and a metal alloy (e.g. aluminum-silicon alloys, aluminum-copper alloys, aluminum-silicon-copper alloys, nichrome, titanium-tungsten alloys, and the like)) using a layering process.

Further, according to various embodiments, a metallization process may include forming additional layers for example as a barrier (e.g. including at least one of molybdenum, platinum silicide, titanium silicide, tungsten silicide, molybdenum silicide, borides, and the like), or as adhesion promoter (e.g. including at least one of platinum silicide, titanium silicide, tungsten silicide, molybdenum silicide, and the like). Further, according to various embodiments, the formation of a silicide may be self-aligned. According to various embodiments, a metalloid may include boron, silicon, germanium, arsenic, antimony, and tellurium.

Plasma systems (e.g. a plasma source) may allow ionizing a variety of source gases in a vacuum system by using for example RF (radio frequency) excitations. The frequency of operation of an RF-power source may be about 13.56 MHz. However, frequency of operation of an RF-power source may be less than about 13.56 MHz (e.g. in the kilohertz range) or greater than about 13.56 MHz (e.g. in the microwave range).

According to various embodiments, one or more electrodes may be used to generate a plasma from the respective source gas. According to various embodiments, a plasma processing system may be operated in a so called deposition mode, wherein at least one reaction product of the plasma process is solid and may condense inside the processing chamber, e.g. at the inner walls of the vacuum chamber. Further, a plasma processing system may be operated in a so called cleaning mode, wherein precipitates condensed inside the processing chamber may be removed. In the deposition mode, the source gas may be optimized or selected to efficiently remove a material from a carrier being processed in the processing chamber, and, in contrast, in the cleaning mode the source gas may be optimized or selected to efficiently remove precipitates or dust (or solid reaction products generated in the deposition mode) from the processing chamber. During the cleaning, the processing chamber may be free of a carrier or wafer to be processed.

According to various embodiments, a so called plasma etcher may be used to perform the dry etching or the hydrogen plasma process, e.g. to perform a first plasma process and a second plasma process subsequently in the very same processing chamber. The plasma may generate the plasma from the process gas (from the etchant or from hydrogen) using a high frequency electric field, e.g. a 13.56 MHz electromagnetic radiation. The electromagnetic field (or the energy) may be coupled inductively or capacitively into the processing region in which the plasma is formed. A carrier may be introduced into the processing chamber, and the air may be evacuated from the processing chamber using one or more vacuum pumps. Subsequently, the process gas may be introduced into the processing chamber at low pressure and the process gas may be excited into a plasma.

According to various embodiments, various layers or a carrier may be patterned for manufacturing integrated circuits, e.g. a titanium nitride layer may be patterned for example during forming a metallization or to provide a hard mask. A plasma etcher may be used for patterning a layer or a carrier in a dry etch process. Therefore, a patterned photoresist may be provided over the layer to be patterned. Subsequently, the dry etch process may be performed so that structured etching is achieved, wherein the pattern from the patterned photoresist may be transferred into the layer or carrier. After the dry etch process, the remaining photoresist may be removed by using the very same plasma etcher, however, referred to as asher.

According to various embodiments, a processing chamber (or vacuum chamber) for a plasma process may include aluminum. The processing chamber may be an aluminum chamber, wherein the inner sidewalls of the processing chamber may be completely covered or at least partially covered with alumina (aluminum oxide).

Figure 1:
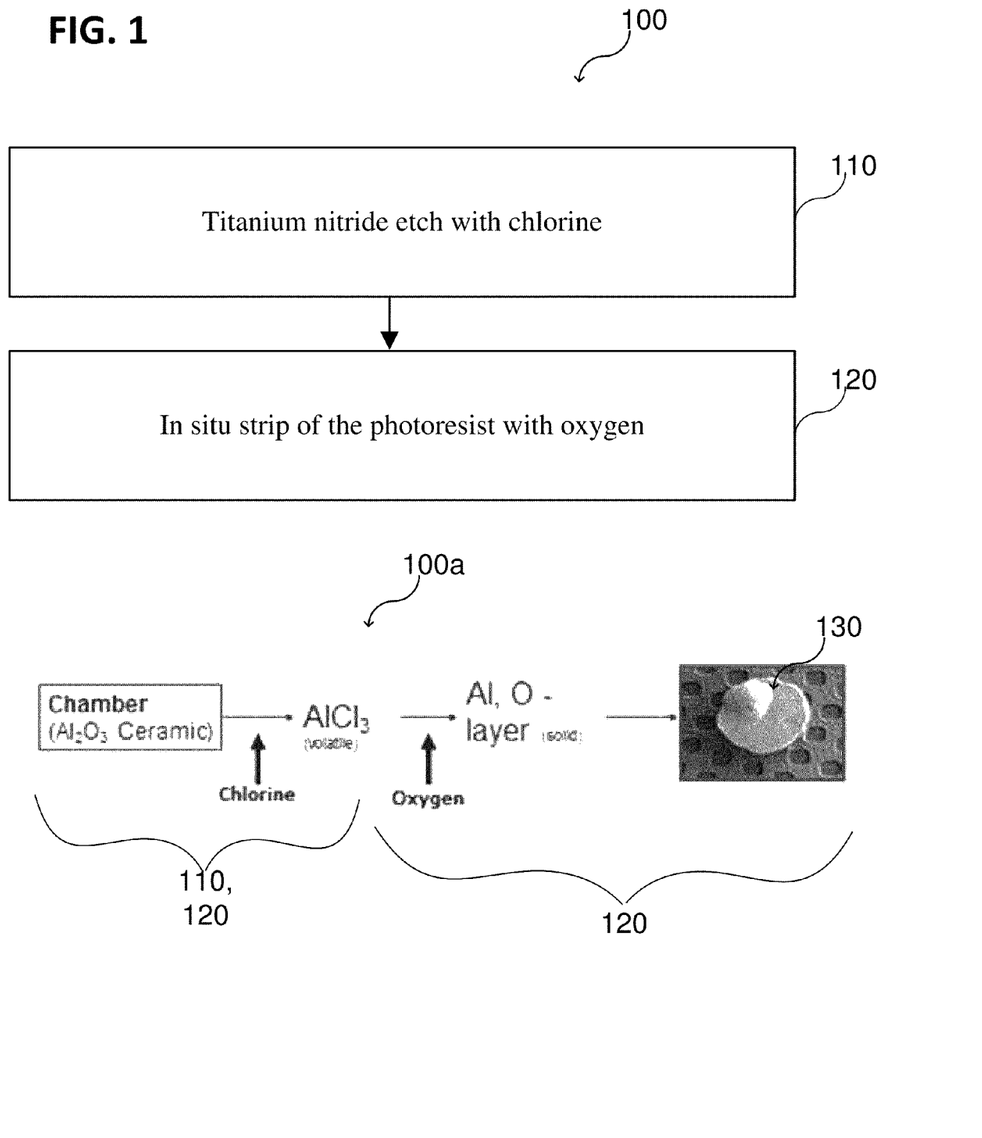
FIG. 1 shows a typical process for etching a titanium layer and removing the resist mask after etching in a schematic flow diagram and possibly occurring chemical reactions during the process.

FIG. 1 illustrates a schematic flow diagram 100 and typically occurring chemical reactions 100a of a typical process for etching a titanium layer and removing the resist mask after the etching. The titanium nitride layer may be etched by dry etching using chlorine as etchant. A resist mask may be disposed over the titanium nitride layer to pattern the titanium nitride layer during the dry etching. It was found, according to various embodiments, that chlorine may be built in or may be introduced into the resist mask during the chlorine based dry etching. As a result, in a subsequently performed in-situ ashing process using oxygen, as typically performed, chlorine may be released from the resist while the resist is removed and the inner sidewall of the processing chamber (in other words reactor material) may be etched (or may chemically react) with the chlorine.

It was found, that if the processing chamber includes aluminum (e.g. pure aluminum, aluminum oxide, or another aluminum compound), the aluminum may chemically react with the chlorine to volatile aluminum chloride ($AlCl_3$), e.g. during the titanium nitride etch 110 and/or during the in-situ strip 120 of the resist mask (the photoresist) with oxygen. In presence of oxygen, the volatile aluminum chloride may further chemically react to alumina (aluminum oxide, e.g. $Al_2O_3$), and the alumina may condense at the inner walls of the processing chamber or may form solid precipitates within the processing chamber. Illustratively, the alumina may be deposited on the inside of the processing chamber or on components arranged inside the processing chamber, which may result in the problems, that, firstly, the deposited alumina may be difficult to remove from the processing chamber during the cyclic cleaning (the cleaning plasma may be for example not efficient to remove the alumina from the inner walls of the processing chamber), and, secondly, alumina particles may fall onto a carrier that is processed in the processing chamber, which may reduce the yield of the manufacturing process.

By increasing the roughness of the reactor parts or of the reactor wall the adhesion of the deposited alumina may be improved, and, therefore, fewer particles may be generated from the deposited alumina. However, the deposition of alumina may not be prevented so that a cyclic cleaning of the reactor by means of an abrasive removal of the deposited alumina may be necessary. As a result, an expensive, external re-coat of the chamber wall may be necessary to form a new durable alumina protection layer at the inner chamber wall.

As a result, typically used plasma processing using oxygen ashing after a chlorine etch may result in high costs for the chamber wall cleaning and the chamber wall recoating and in particle problems due to flake off of the deposited alumina (alumina disks 130).

Figure 2:
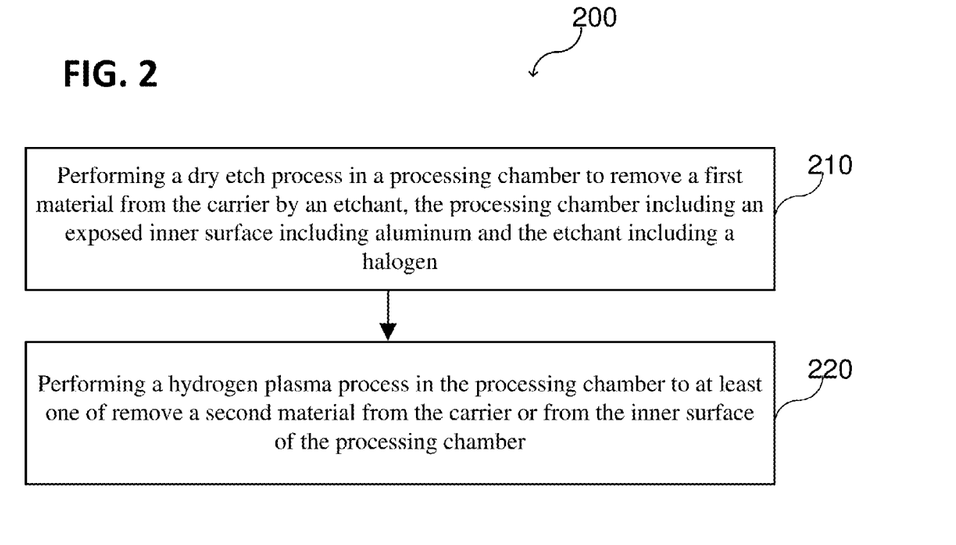
FIG. 2 shows a schematic flow diagram of a method for processing a carrier according to various embodiments.

FIG. 2 illustrates a schematic flow diagram of a method 200 for processing a carrier according to various embodiments, the method including: in 210, performing a dry etch process in a processing chamber to remove a first material from the carrier by an etchant, the processing chamber including an exposed inner surface including aluminum and the etchant including a halogen; and, subsequently, in 220, performing a hydrogen plasma process in the processing chamber to remove a second material from at least one of the carrier or the inner surface of the processing chamber.

According to various embodiments, the hydrogen plasma process (a second plasma process) may be performed immediately after the dry etch process (a first plasma process), that means that there may be no other plasma process in between. Illustratively, the second material may include a resist mask and the first material may be a material layer to be patterned by the dry etching using the resist mask, wherein the ashing of the resist mask by the hydrogen plasma may be performed in-situ after the material layer may be patterned by the dry etching.

According to various embodiments, the first material (e.g. the material to be patterned by the dry etching or the material to be etched by the dry etching) may include at least one of the following: a metal (e.g. titanium, molybdenum, tungsten or tantalum); a metalloid (e.g. silicon), a metal alloy (e.g. AlCu); a metal nitride (e.g. titanium nitride or tantalum nitride); a metalloid nitride (e.g. silicon nitride); metal oxide (e.g. titanium oxide or tantalum oxide); a metalloid oxide (e.g. silicon oxide); a metal oxynitride (e.g. titanium oxynitride or tantalum oxynitride); a metalloid oxynitride (e.g. e.g. silicon oxynitride); a metal carbide (e.g. titanium carbide or tantalum carbide); a metalloid carbide (e.g. silicon carbide), or any other metal or metal compound, or any other metal alloy, metalloid or metalloid compound desired for semiconductor processing.

According to various embodiments, the halogen may include at least one of the following fluorine; chlorine; bromine; and iodine. The halogen may be fluorine gas or a fluorine containing compound; chlorine gas or a chlorine containing compound; bromine gas or a bromine containing compound; iodine gas or a iodine containing compound.

According to various embodiments, the etchant for the dry etching (plasma etching) may include a halocarbon, a halide, or a monomer or polymer including one or more halogens. As already described, the second material may include a resist, e.g. a photoresist, or a solid organic compound. Therefore, the hydrogen plasma process may be an ashing process removing the organic compound, a so called resist strip process.

Further, a portion of the halogen of the etchant may react with the resist or organic compound during the dry etch process. As already described, a portion of the inner surface of the processing chamber (in other words of the reactor) may chemically react with the halogen of the etchant to an aluminium halide (halogenide), e.g. to $AlF_3$, $AlCl_3$. $AlBr_3$, $AlI_3$.

Figure 3:
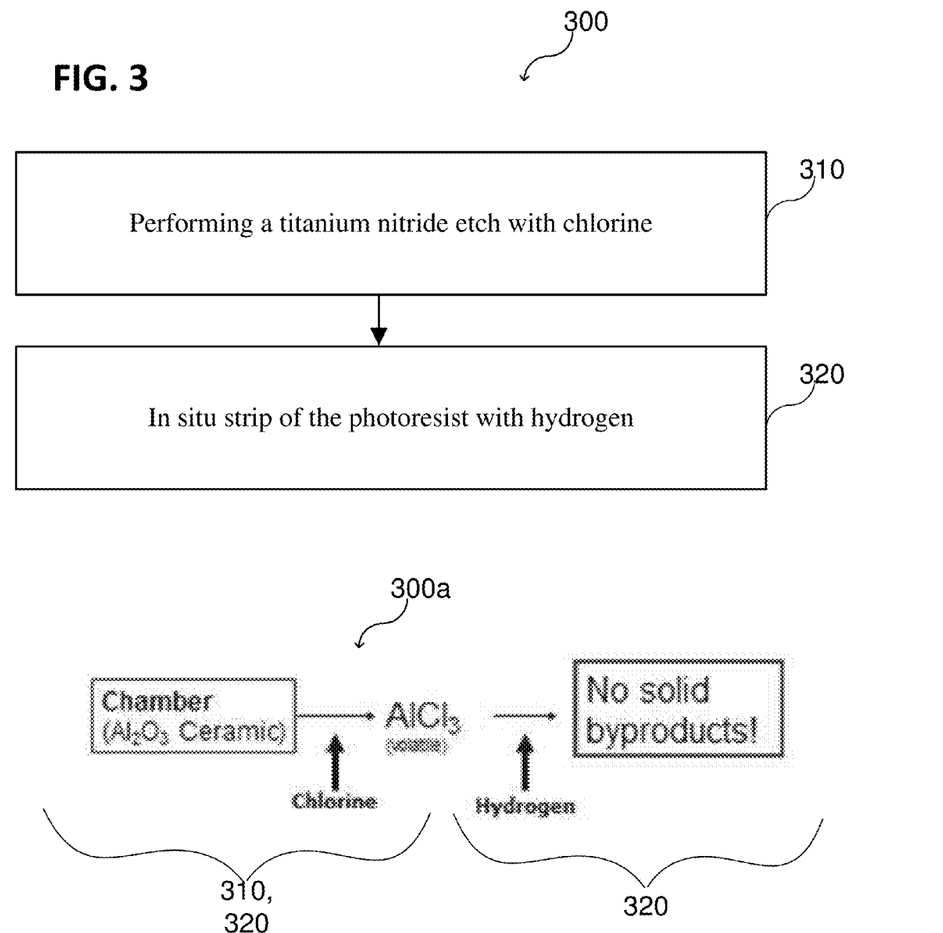
FIG. 3 shows a method for etching a titanium layer and removing the resist mask from the carrier after etching in a schematic flow diagram and possibly occurring chemical reactions during the process, according to various embodiments.

As exemplarily illustrated in FIG. 3, according to various embodiments, performing a titanium nitride etch 310 (a patterning of a titanium nitride layer) with chlorine and, subsequently, performing an in-situ strip 320 of the photoresist with hydrogen, may not result in solid byproducts, since the aluminum may not form a solid material in presence of hydrogen (and/or in absence of substantial amounts of oxygen) which could condense within the processing chamber. FIG. 3 illustrates a method 300 for etching (patterning or partially removing) a titanium layer and removing (stripping) the resist mask from the carrier after the etching of the titanium layer in a schematic flow diagram and possibly occurring chemical reactions 300a during the etching and stripping, according to various embodiments.

According to various embodiments, the formation of alumina during the plasma processes may be prevented by providing an oxygen free ashing process to remove the resist. According to various embodiments, hydrogen ($H_2$) or a hydrogen/nitrogen ($H_2/N_2$) mixture may be used to strip or ash the resist. In case a titanium nitride (TiN) layer is etched in the dry etching, an oxidation of titanium nitride to a titanium oxide may be prevented. This may result in a greater accuracy during the etching and, therefore, in a smaller critical dimension (CD) of the dry etch process.

According to various embodiments, the processing chamber may be purged with purge gas (e.g. with nitrogen) before performing the hydrogen plasma process, therefore, residual etchant may be removed from the processing chamber. However, a halogen may be released in the processing chamber during the hydrogen plasma process, since a halogen may be introduced into the resist during the dry etching, wherein the resist is ashed by the hydrogen plasma process.

According to various embodiments, the dry etch process may be performed by using an RF-plasma source, as already described. Further, the hydrogen plasma process may be performed by using an RF-plasma source, as already described. The process gas for the dry etch process may be referred to as etchant, wherein at least one of hydrogen gas or a hydrogen containing gas may be used as process gas for the hydrogen plasma process. The hydrogen plasma process may be a cleaning process to remove precipitates generated by the dry etch process from the processing chamber in gaseous form.

According to various embodiments, the processing chamber may be evacuated and the respective process gas may be introduced into the processing chamber during the dry etch process and during the hydrogen plasma process.

According to various embodiments, an oxidation of aluminum halide (e.g. aluminum chloride) may be prevented in the processing chamber being used for opening a titanium nitride hard mask. Illustratively, the titanium nitride layer may be opened by the dry etch process to provide a patterned titanium nitride layer as hard mask. According to various embodiments, it was found, that oxygen may affect the processing in the processing chamber by forming aluminum oxide. According to various embodiments, an ashing process may be used after the hard mask open using hydrogen and nitrogen. The process gas for the ashing process (the second plasma process or the hydrogen plasma process) may be substantially free of oxygen.

According to various embodiments, the oxygen free in-situ resist strip may be used for patterning any hard mask including a metal or metalloid, e.g. for titanium nitride and tantalum nitride hard masks. The oxygen free in-situ strip provided herein may result in a higher CD-accuracy, in a cleaner processing (a better particle performance), and less maintenance costs (e.g. due to an easier and less often chamber cleaning) compared to a typically used oxygen based in-situ resist strip.

It should be noted, that this processing may allow using a processing chamber with an alumina protection coating at the inside of the processing chamber instead of expensive yttria-coated processing chambers used, for example, for low-k material processing. According to various embodiments, the processing chamber may be an ICP-metal-chamber or a poly-etch chamber. In a further embodiment, the plasma may be provided remotely and may be inserted into the processing chamber.

Figure 4:
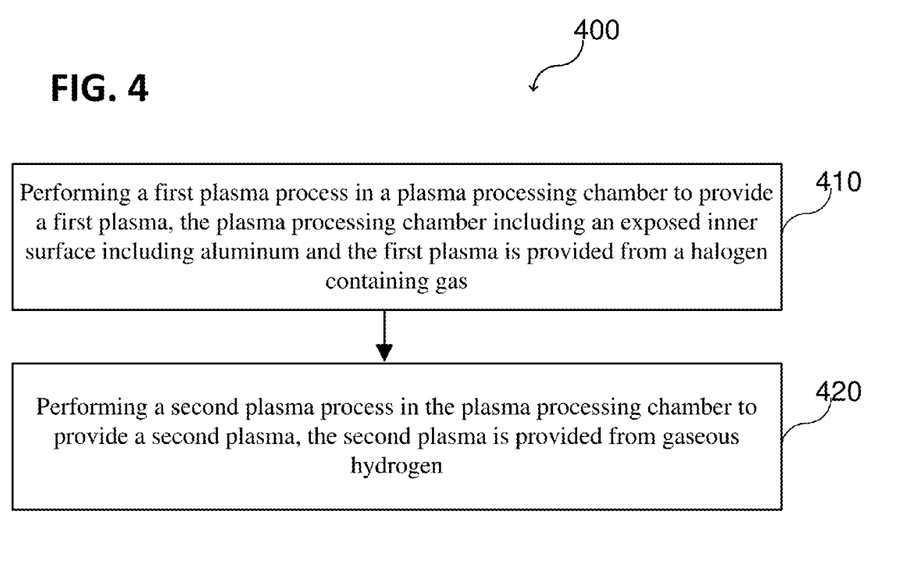
FIG. 4 shows a schematic flow diagram of a method for operating a plasma processing chamber according to various embodiments.

FIG. 4 shows a schematic flow diagram of a method 400 for operating a plasma processing chamber according to various embodiments, the method 400 may include: in 410, performing a first plasma process in a plasma processing chamber to provide a first plasma, the plasma processing chamber including an exposed inner surface including aluminum and the first plasma is provided from a halogen containing gas; and, subsequently, in 420, performing a second plasma process in the (very same) plasma processing chamber to provide a second plasma, the second plasma is provided from gaseous hydrogen.

According to various embodiments, the method 400 may further include: before processes 410 and 420 have been carried out, disposing a carrier in the plasma processing chamber, the carrier including at least one portion of a first material to be removed from the carrier in the first plasma process; and the carrier further including at least one portion of a second material to be removed from the carrier in the second plasma process.

As already described, the first material may include a metal nitride (a hard mask material), wherein the halogen plasma may be provided from a chlorine containing gas, and the second material may include a photoresist (e.g. a soft mask for patterning the hard mask material during the first plasma process).

According to various embodiments, the first plasma process may include: introducing the halogen containing gas into the plasma processing chamber; activating a plasma source to form the first plasma from the introduced halogen containing gas; deactivating the plasma source; and removing the residual halogen containing gas from the plasma processing chamber.

According to various embodiments, the second plasma process may include: introducing gaseous hydrogen or a mixture of gaseous hydrogen and gaseous nitrogen into the plasma processing chamber; activating the plasma source to form the second plasma from the introduced gaseous hydrogen; deactivating the plasma source; and removing the residual gaseous hydrogen from the plasma processing chamber.

Figure 5:
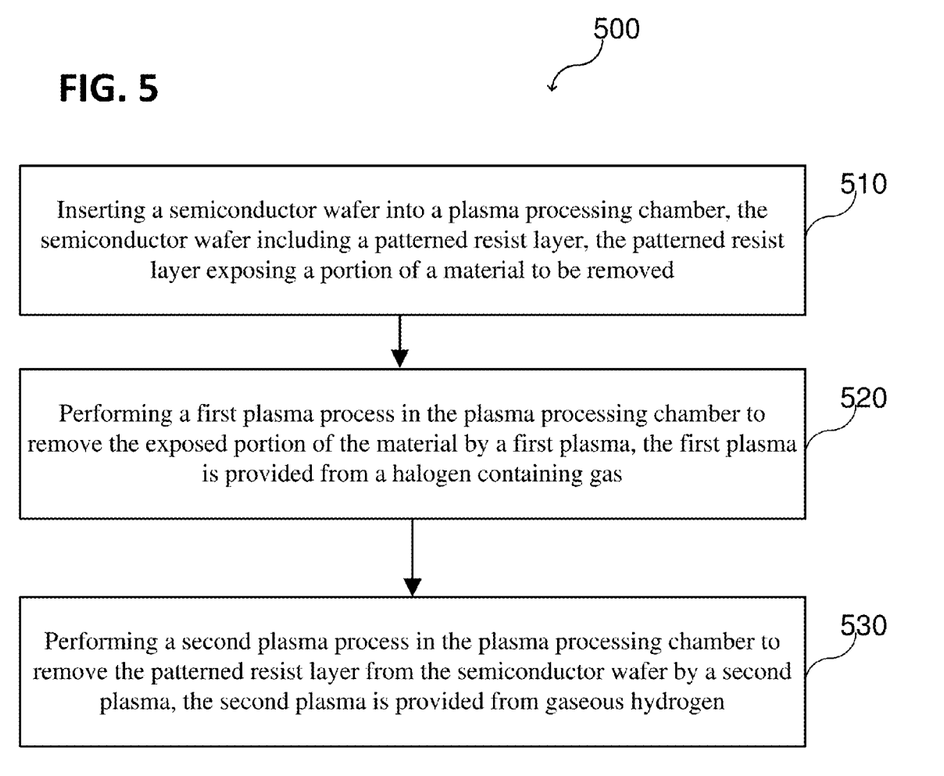
FIG. 5 shows a schematic flow diagram of a method for processing a semiconductor wafer according to various embodiments.

FIG. 5 shows a schematic flow diagram of a method 500 for processing a semiconductor wafer according to various embodiments; the method 500 may include: in 510, inserting a semiconductor wafer into a plasma processing chamber, the semiconductor wafer including a patterned resist layer, the patterned resist layer exposing a portion of a material to be removed; (e.g. subsequently) in 520, performing a first plasma process in the plasma processing chamber to remove the exposed portion of the material by a first plasma, the first plasma is provided from a halogen containing gas; and (e.g. subsequently), in 530, performing a second plasma process in the plasma processing chamber to remove the patterned resist layer from the semiconductor wafer by a second plasma, the second plasma is provided from gaseous hydrogen.

Figure 6:
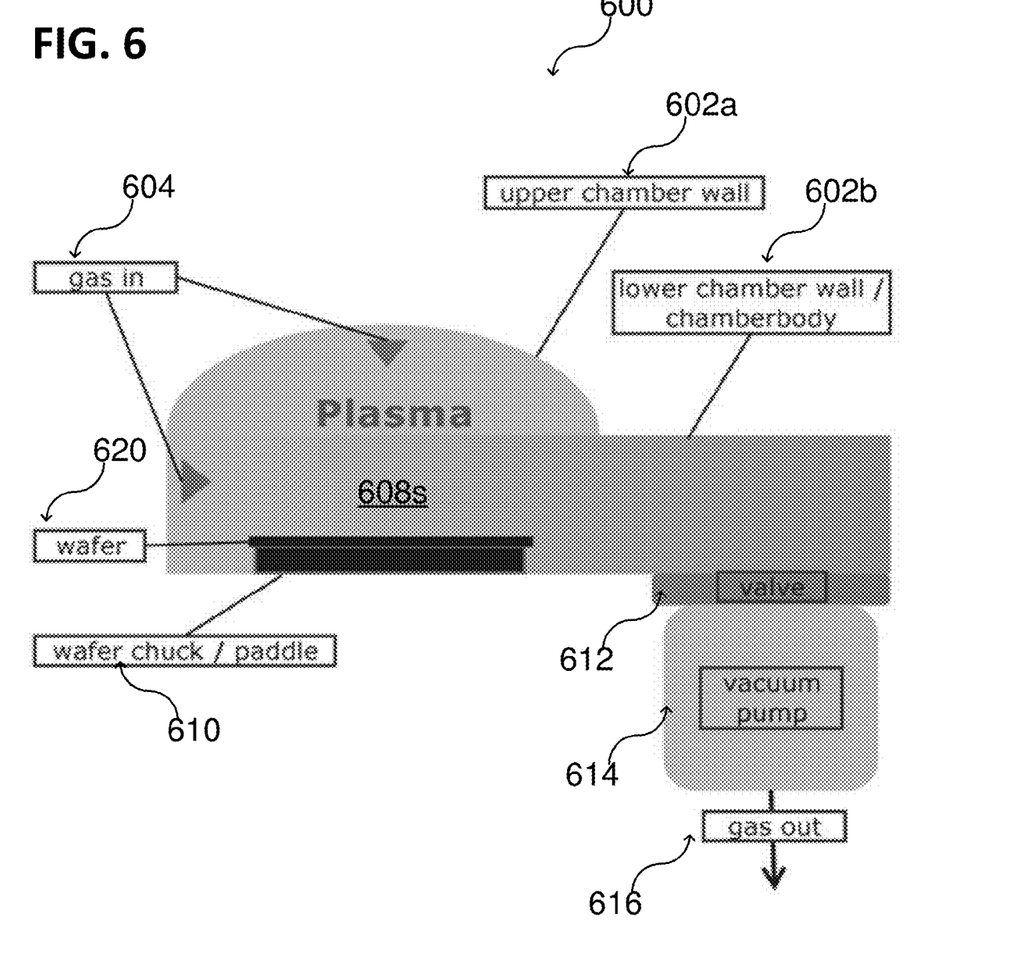
FIG. 6 shows a plasma processing chamber in a schematic side view or cross sectional view according to various embodiments.

FIG. 6 schematically illustrates a plasma processing chamber in a schematic side view or cross sectional view according to various embodiments. According to various embodiments, a plasma processing device may include: a plasma processing chamber providing a processing region within the plasma processing chamber, the plasma processing chamber including aluminum exposed to the processing region. According to various embodiments, a plasma processing device may further include a gas inlet structure to introduce gas into the processing region. The plasma processing device may further include a first gas control system coupled to the gas inlet structure and configured to introduce a gaseous etchant into the processing region, the gaseous etchant including a halogen. The plasma processing device may further include a second gas control system coupled to the gas inlet structure and configured to introduce hydrogen into the processing region. The plasma processing device may further include a plasma source coupled to the plasma processing chamber, the plasma source configured to form a first plasma in the processing region from the gaseous etchant and to form a second plasma in the processing region from the hydrogen.

According to various embodiments, the first gas control system, the second gas control system, and the plasma source may be configured to form the first plasma for a first duration, and, subsequently (e.g. immediately following), to form the second plasma for a second duration.

FIG. 6 illustrates a plasma processing device 600 including a processing chamber, the processing chamber including an upper chamber wall 602*a* and a lower chamber wall and a chamber body 602*b*. The upper chamber wall 602*a* may be dome shaped. A plasma may be generated in a processing region 608*s* of the processing chamber or may be introduced into the processing region 608*s* of the processing chamber to process for example a wafer 620. The wafer 620 may be mounted on a wafer chuck 610. Further, the process gas may be introduced into the processing chamber by a gas inlet structure 604. The introduction of the process gas and the plasma formation may be controlled by a respectively configured control system (not illustrated).

According to various embodiments, the processing chamber may be coupled to a vacuum pump 614 or a vacuum pump system 614 so that gas may be pumped out from the processing chamber into a gas out 616. The vacuum pump 614 may be coupled to and disconnected from the processing chamber by a valve 612.

According to various embodiments, the processing chamber may be configured to perform at least one process as described herein, e.g. a first plasma process (a dry etching) and a second plasma process (an ashing) in the same processing region 608s.

According to various embodiments, the upper chamber wall 602a and the lower chamber wall and the chamber body 602b may include an alumina coating at the inside, the alumina coating may be exposed to the processing region 608s.

According to various embodiments, a method for processing a carrier may include: performing a dry etch process in a processing chamber to remove a first material from the carrier by an etchant, the processing chamber including an exposed inner surface including aluminum and the etchant including a halogen; and, subsequently; performing a hydrogen plasma process in the processing chamber to remove a second material from at least one of the carrier or the inner surface of the processing chamber.

According to various embodiments, the first material may include at least one of the following materials: a metal; a metalloid, a metal alloy; a metal nitride; a metalloid nitride; a metal oxide; a metalloid oxide; a metal oxynitride; a metalloid oxynitride; a metal carbide; a metalloid carbide.

According to various embodiments, the halogen may include at least one of the following: fluorine; chlorine; bromine; iodine.

According to various embodiments, the etchant may include a halocarbon or a halide.

According to various embodiments, the second material may include a resist, e.g. a photoresist.

According to various embodiments, a portion of the halogen may chemically react with the resist during the dry etch process.

According to various embodiments, the hydrogen plasma process may be a resist strip process.

According to various embodiments, a portion of the inner surface of the processing chamber may chemically react with the halogen to an aluminum halide.

According to various embodiments, the method for processing a carrier may further include: purging the processing chamber with purge gas before performing the hydrogen plasma process to remove residual etchant from the processing chamber.

According to various embodiments, the dry etch process may include providing a plasma from the etchant by means of an RF-plasma source.

According to various embodiments, the hydrogen plasma process may include providing a plasma from at least one of hydrogen gas or a hydrogen containing gas by means of an RF-plasma source.

According to various embodiments, the hydrogen plasma process may be a cleaning process to remove precipitates generated by the dry etch process from the processing chamber in gaseous form.

According to various embodiments, the method for processing a carrier may further include: evacuating the processing chamber during the dry etch process and during the hydrogen plasma process.

According to various embodiments, the carrier may include a semiconductor wafer.

According to various embodiments, a method for operating a plasma processing chamber may include: performing a first plasma process in a plasma processing chamber to provide a first plasma, the plasma processing chamber including an exposed inner surface including aluminum and the first plasma is provided from a halogen containing gas; and, subsequently (e.g. in-situ and/or immediately following), performing a second plasma process in the plasma processing chamber to provide a second plasma, the second plasma is provided from gaseous hydrogen.

According to various embodiments, the method for operating a plasma processing chamber may further include disposing a carrier in the plasma processing chamber, the carrier including at least one portion of a first material to be removed from the carrier in the first plasma process and the carrier further including at least one portion of a second material to be removed from the carrier in the second plasma process.

According to various embodiments, the first material may include a metal nitride, wherein the halogen plasma may be provided from a chlorine containing gas, and wherein the second material includes a photoresist.

According to various embodiments, the first plasma process may include: introducing the halogen containing gas into the plasma processing chamber; activating a plasma source to form the first plasma from the introduced halogen containing gas; deactivating the plasma source; and removing the residual halogen containing gas from the plasma processing chamber.

According to various embodiments, the second plasma process may include: introducing the gaseous hydrogen into the plasma processing chamber; activating the plasma source to form the second plasma from the introduced gaseous hydrogen; deactivating the plasma source; and removing the residual gaseous hydrogen from the plasma processing chamber.

According to various embodiments, a method for processing a semiconductor wafer may include: inserting a semiconductor wafer into a plasma processing chamber, the semiconductor wafer including a patterned resist layer (e.g. a soft mask), the patterned resist layer exposing a portion of a material to be removed; performing a first plasma process in the plasma processing chamber to remove the exposed portion of the material by a first plasma, the first plasma is provided from a halogen containing gas; and, subsequently, performing a second plasma process in the plasma processing chamber to remove the patterned resist layer from the semiconductor wafer by a second plasma, the second plasma is provided from gaseous hydrogen.

According to various embodiments, a plasma processing device may include: a processing chamber providing a processing region within the processing chamber, the processing chamber including aluminum exposed to the processing region; a gas inlet structure to introduce gas into the processing region; a first gas control system coupled to the gas inlet structure and configured to introduce a gaseous etchant into the processing region, the gaseous etchant including a halogen; a second gas control system coupled to the gas inlet structure and configured to introduce hydrogen into the processing region; a plasma source coupled to the processing chamber, the plasma source configured to form a first plasma in the processing region from the gaseous etchant and to form a second plasma in the processing region from the hydrogen.

According to various embodiments, the first gas control system, the second gas control system, and the plasma source may be configured to form the first plasma for a first duration, and, subsequently (e.g. immediately following), to form the second plasma for a second duration.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a carrier, the method comprising:
   performing a dry etch process in a processing region of a processing chamber to remove a first material from the carrier by an etchant, the processing chamber comprising an exposed inner surface comprising aluminum and the etchant comprising a halogen; and, subsequently,
   performing a hydrogen plasma ash process in the same processing region of the processing chamber, thereby stripping a resist mask from the carrier, wherein the hydrogen plasma process is substantially free of oxygen.

2. The method according to claim 1,
   wherein the first material comprises at least one material of the following group of materials, the group consisting of:
   a metal; a metalloid, a metal alloy;
   a metal nitride; a metalloid nitride;
   a metal oxide; a metalloid oxide;
   a metal oxynitride; a metalloid oxynitride;
   a metal carbide; a metalloid carbide.

3. The method according to claim 1,
   wherein the halogen comprises at least one halogen of the following group of halogens, the group consisting of:
   fluorine;
   chlorine;
   bromine; and
   iodine.

4. The method according to claim 1,
   wherein the etchant comprises a halogen compound.

5. The method according to claim 1,
   wherein a portion of the halogen chemically reacts with the resist during the dry etch process.

6. The method according to claim 1,
   wherein the hydrogen plasma process is a resist strip process.

7. The method according to claim 1,
   wherein a portion of the inner surface of the processing chamber chemically reacts with the halogen to an aluminum halide.

8. The method according to claim 1, further comprising:
   purging the processing chamber with purge gas before performing the hydrogen plasma process to remove residual etchant from the processing chamber.

9. The method according to claim 1,
   wherein the dry etch process comprises providing a plasma from the etchant by means of an RF-plasma source.

10. The method according to claim 1,
    wherein the hydrogen plasma process comprises providing a plasma from at least one of hydrogen gas or a hydrogen containing gas by means of an RF-plasma source.

11. The method according to claim 1,
    wherein precipitates generated by the dry etch process at the inner sidewall of the processing chamber are removed from the processing chamber in gaseous form by the hydrogen plasma process.

12. The method according to claim 1, further comprising:
    evacuating the processing chamber during the dry etch process and during the hydrogen plasma process.

13. The method according to claim 1,
    wherein the carrier comprises a semiconductor wafer.

14. A method for operating a plasma processing chamber, the method comprising:
    disposing a carrier in a plasma processing chamber, the carrier comprising at least one portion of a first material to be removed from the carrier in a first plasma process; and the carrier further comprising a resist layer to be removed from the carrier in a second plasma process; and subsequently
    performing the first plasma process in the plasma processing chamber to provide the first plasma, thereby removing the at least one portion of the first material, wherein the plasma processing chamber comprises an exposed inner surface comprising aluminum and the first plasma is provided from a halogen containing gas; and, subsequently,
    in-situ performing the second plasma process in the plasma processing chamber to provide a second plasma, thereby removing the resist layer, wherein the second plasma is provided from gaseous hydrogen, wherein the second plasma process is substantially free of oxygen.

15. The method according to claim 14,
    wherein the first material comprises a metal nitride, wherein the halogen plasma is provided from a chlorine containing gas, and wherein the resist layer comprises a patterned photoresist.

16. The method according to claim 14,
    wherein the first plasma process comprises:
    introducing the halogen containing gas into the plasma processing chamber;
    activating a plasma source to form the first plasma from the introduced halogen containing gas;
    deactivating the plasma source; and
    removing the residual halogen containing gas from the plasma processing chamber.

17. The method according to claim 14,
    wherein the second plasma process comprises:
    introducing the gaseous hydrogen into the plasma processing chamber;
    activating the plasma source to form the second plasma from the introduced gaseous hydrogen;
    deactivating the plasma source; and
    removing the residual gaseous hydrogen from the plasma processing chamber.

18. A method for processing a semiconductor wafer, the method comprising:
    inserting a semiconductor wafer into a processing region of a plasma processing chamber, the semiconductor wafer comprising a patterned resist layer, the patterned resist layer exposing a portion of a material to be removed;
    performing a first plasma process in the processing region of the plasma processing chamber to remove the exposed portion of the material by a first plasma, wherein the first plasma is provided from a halogen containing gas by a plasma source coupled to the plasma processing chamber; and, subsequently, performing a second plasma process in the same processing region of the plasma processing chamber, thereby completely removing the patterned resist layer from the semiconductor wafer by a second plasma, wherein the second plasma is provided from gaseous hydrogen by the same plasma source.

* * * * *